(12) United States Patent
Srinivasan et al.

(10) Patent No.: US 9,287,123 B2
(45) Date of Patent: Mar. 15, 2016

(54) TECHNIQUES FOR FORMING ANGLED STRUCTURES FOR REDUCED DEFECTS IN HETEROEPITAXY OF SEMICONDUCTOR FILMS

(71) Applicant: Varian Semiconductor Equipment Associates, Inc., Gloucester, MA (US)

(72) Inventors: Swaminathan Srinivasan, Milpitas, CA (US); Fareen Adeni Khaja, Gloucester, MA (US); Simon Ruffell, South Hamilton, MA (US); John Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/459,813

(22) Filed: Aug. 14, 2014

(65) Prior Publication Data

US 2015/0311073 A1    Oct. 29, 2015

Related U.S. Application Data

(60) Provisional application No. 61/984,902, filed on Apr. 28, 2014.

(51) Int. Cl.
*H01L 21/461* (2006.01)
*H01L 21/02* (2006.01)
*H01L 21/311* (2006.01)
*H01L 29/04* (2006.01)
*H01L 29/06* (2006.01)
*H01L 29/267* (2006.01)

(52) U.S. Cl.
CPC ...... *H01L 21/02658* (2013.01); *H01L 21/0214* (2013.01); *H01L 21/0217* (2013.01); *H01L 21/0254* (2013.01); *H01L 21/0259* (2013.01); *H01L 21/02164* (2013.01); *H01L 21/02381* (2013.01); *H01L 21/02433* (2013.01); *H01L 21/02488* (2013.01); *H01L 21/02513* (2013.01); *H01L 21/02538* (2013.01); *H01L 21/02543* (2013.01); *H01L 21/02546* (2013.01); *H01L 21/311* (2013.01); *H01L 21/31116* (2013.01);
(Continued)

(58) Field of Classification Search
CPC ............ H01L 21/02658; H01L 21/311; H01L 21/02513; H01L 21/0259; H01L 21/02381
USPC ......................................................... 438/690
See application file for complete search history.

(56) References Cited

U.S. PATENT DOCUMENTS 7,767,977 B1    8/2010    Godet et al.
8,101,510 B2    1/2012    Godet et al.
(Continued)

OTHER PUBLICATIONS

Steven R. Sherman, et al., Techniques for Processing Substrates Using Directional Reactive Ion Etching, U.S. Appl. No. 14/230,642, filed Mar. 31, 2014.
(Continued)

*Primary Examiner* — Luan C Thai

(57) ABSTRACT

In one embodiment, a method for etching a substrate includes providing a reactive ambient around the substrate when a non-crystalline layer is disposed over a first crystalline material in the substrate; generating a plasma in a plasma chamber; modifying a shape of a plasma sheath boundary of the plasma; extracting ions from the plasma; and directing the ions to the substrate at a non-zero angle of incidence with respect to a perpendicular to a plane of the substrate, wherein the ions and reactive ambient are effective to form an angled cavity through the non-crystalline layer to expose a portion of the first crystalline material at a bottom of the angled cavity, and the angled cavity forms a non-zero angle of inclination with respect to the perpendicular.

20 Claims, 7 Drawing Sheets

(52) U.S. Cl.
CPC .......... *H01L 29/045* (2013.01); *H01L 29/0649* (2013.01); *H01L 29/0684* (2013.01); *H01L 29/267* (2013.01)

(56) References Cited

U.S. PATENT DOCUMENTS

| | | | |
|---|---|---|---|
| 8,288,741 | B1 | 10/2012 | Miller et al. |
| 8,603,591 | B2 | 12/2013 | Godet et al. |
| 8,716,682 | B2 * | 5/2014 | Renau et al. ............. 250/492.21 |
| 2009/0137106 | A1 * | 5/2009 | Nunan .......................... 438/524 |

OTHER PUBLICATIONS

Jin-Kwan Lee, et al., Oblique-Directional Plasma Etching of Si Using a Faraday Cage, Journal of the Electrochemical Society, 2009, pp. D222-D225 vol. 158, No. 7. Electrochemical Society.

* cited by examiner

TECHNIQUES FOR FORMING ANGLED STRUCTURES FOR REDUCED DEFECTS IN HETEROEPITAXY OF SEMICONDUCTOR FILMS

RELATED APPLICATIONS

This application claims priority to U.S. provisional patent application No. 61/984,902, entitled "Utilization of angled trench for effective aspect ratio trapping of defects in strain-relaxed heteroepitaxy of semiconductor films," filed Apr. 24, 2014, and incorporated by reference herein in its entirety.

FIELD

Embodiments of the present disclosure relate to heteroepitaxial growth of materials with high lattice mismatch. More particularly, embodiments of the present disclosure relate to reducing dislocation density in a heteroepitaxially grown film and devices including heteroepitaxial films with reduced dislocation density.

BACKGROUND

Heteroepitaxy, a process for crystalline film growth on a crystalline substrate of a film of a different material than the substrate, has many practical applications. For example, germanium (Ge) heteroepitaxy on silicon (Si) is used as p-channel in field effect transistors (FET). However, heteroepitaxially grown films are prone to defects, such as dislocations, anti-phase boundaries, and stacking faults, due to the lattice mismatch between the crystalline materials.

Aspect ratio trapping (ART) has been used to reduce defects in heteroepitaxially grown films (heteroepitaxial film). In aspect ratio trapping, a crystalline material grows in deep, narrow, i.e. high aspect ratio, trenches so that some dislocations caused by lattice mismatch may terminate at the trench walls, thus, trapped in the high aspect ratio trenches rather than running up into active channel area of the device/crystalline material.

However, conventional aspect ratio trapping cannot terminate dislocations generated in along the length of the narrow trenches. Therefore, there is a need for methods and structures with reduced defects in a heteroepitaxial film.

SUMMARY

In one embodiment, a method for etching a substrate includes providing a reactive ambient around the substrate when a non-crystalline layer is disposed over a first crystalline material in the substrate; generating a plasma in a plasma chamber; modifying a shape of a plasma sheath boundary of the plasma; extracting ions from the plasma; and directing the ions to the substrate at a non-zero angle of incidence with respect to a perpendicular to a plane of the substrate, wherein the ions and reactive ambient are effective to form an angled cavity through the non-crystalline layer to expose a portion of the first crystalline material at a bottom of the angled cavity, and the angled cavity forms a non-zero angle of inclination with respect to the perpendicular.

In a further embodiment, a method for forming a semiconductor device includes forming a non-crystalline layer over a first crystalline material in a substrate; providing a reactive ambient around the substrate; directing ions from a plasma to the substrate at a non-zero angle of incidence with respect to a perpendicular to a plane of the substrate, etching the non-crystalline layer using the ions and reactive ambient to form an angled cavity through the non-crystalline layer, wherein a portion of the first crystalline material at a bottom of the angled cavity is exposed, the angled cavity forming a non-zero angle of inclination with respect to the perpendicular; and growing a second crystalline material from the bottom of the angled cavity by epitaxial growth, wherein the second crystalline material fills the angled cavity, and wherein the first and second crystalline materials have mismatched lattice dimensions.

In a further embodiment, a method for forming a semiconductor device includes forming a dielectric layer over a silicon-containing crystalline substrate; forming an angled trench by etching the dielectric layer, using ions in combination with a reactive ambient, to expose a portion of the silicon containing crystalline substrate at a bottom of the angled trench, wherein an angle of inclination between sidewalls of the angled trench and a top surface of the silicon-containing crystalline substrate is greater than $$\tan^{-1}\frac{h}{w},$$

where h represents a thickness of the dielectric layer, and w represents a width of the angled trench along the top surface of the silicon containing crystalline substrate; etching the portion of the silicon-containing crystalline substrate at the bottom of the angled trench to produce a surface along (111) crystal plane direction; and forming a crystalline material comprising a Group III element and a Group V element in the angled trench by epitaxial growth.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate just some embodiments of this disclosure and are therefore not to be considered limiting of its scope, for the disclosure may admit to other equally effective embodiments.

To facilitate understanding, identical reference numerals have been used, where possible, to designate identical elements that are common to the FIG.s. It is contemplated that elements disclosed in one embodiment may be beneficially utilized on other embodiments without specific recitation.

DETAILED DESCRIPTION

Figure 1A:
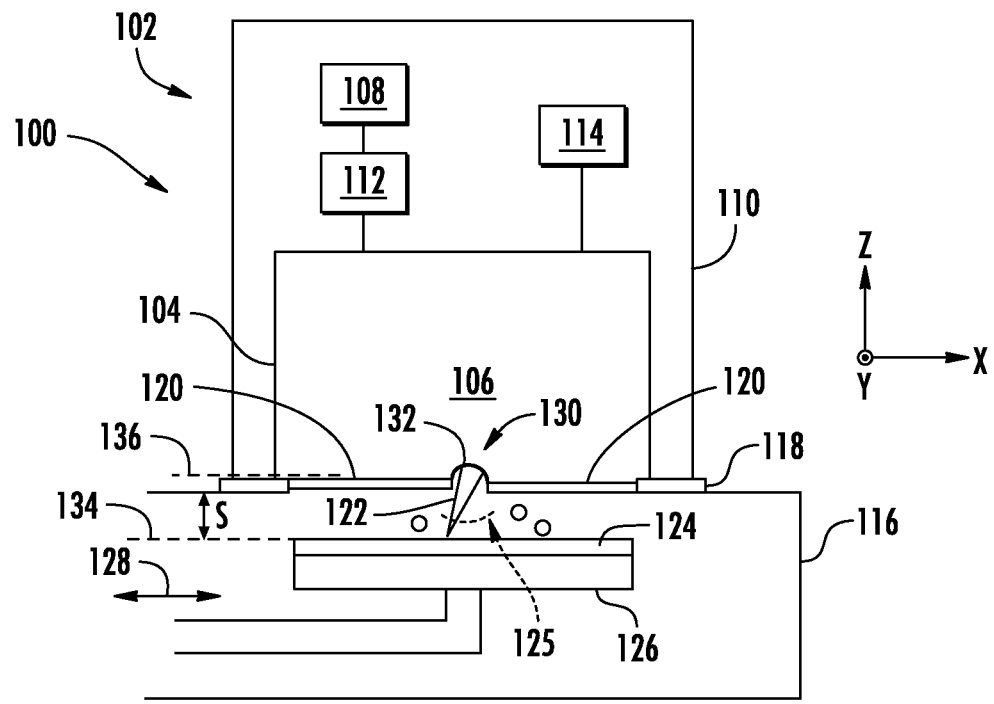
FIG. 1A presents a schematic and block diagram in side view of a processing system consistent with various embodiments.

According to embodiments of the present disclosure, sidewalls of high aspect ratio trenches may be tilted or angled to allow defects in crystalline material formed in the high aspect ratio trenches to be terminated in the tilted sidewalls, including defects propagating along the length of the high aspect ratio trenches. Embodiment of the present disclosure may be used to reduce defects in any crystalline films formed by heteroepitaxy. For example, embodiments of the present disclosure may be used to reduce defects in heteroepitaxial growth on silicon (Si) for microelectronic applications, such as high mobility channels using Group III-V elements in field effect transistors. Embodiments of the present disclosure may also be used in forming other epitaxial films, such as gallium nitride (GaN) films formed on sapphire, aluminum gallium indium phosphide (AlGaInP) film formed on gallium arsenide (GaAs) or diamond or iridium.

Also, according to various embodiments disclosed herein, substrates are processed using ions extracted from a plasma source, or more specifically, high aspect ratio trenches are created using the ions extracted from the plasma source. The various embodiments are related to reactive etching of the substrates and entail the use of directional ions to achieve directional reactive etching of substrates including patterned features on a substrate surface.

Various embodiments disclosed herein provide for directional reactive ion etching, where ion assisted plasma etching of surfaces with ions at angles not perpendicular to the wafer surface and where the wafer is not tilted. Various embodiments disclosed herein provide for changing between a pure chemical etch, to an ion-assisted chemical etch, to physical (sputter) etch within a single process chamber.

Various embodiments disclosed herein provide for reactive ion beam etching using angled ions as detailed below. Thus, in addition to angled ions, a reactive gas, such as oxygen, nitrogen or hydrogen, is provided to an ion source resulting in a reactive ion flux directed at a substrate. Reactive ions or inert ions may form part of an ion beam. In addition, reactive species such as a reactive gas that is not ionized may be provided to a substrate. An ion flux is created that reacts with a reactive gas, such as chlorine, hydrogen, fluorine, prior to striking substrate. Thus, reactive species may be introduced near a wafer (substrate) surface, independent of the ion beam.

In various embodiments disclosed herein substrates are processed using ions extracted from a plasma source. A plasma source consistent with the present embodiments may include a plasma chamber in which ions are generated for providing to the substrate. The substrates may be disposed in a "process" chamber that is separate from a plasma chamber used to generate ions that are provided to the substrate. Species may be provided to a plasma chamber that are configured to generate a reactive environment at the substrate in which reactive ion etching takes place. Various ions, in particular, are generated in the plasma chamber and extracted through an aperture as an ion beam that impinges upon the substrate in a process chamber adjacent the plasma chamber. Consistent with the present embodiments, the extraction of the ions through the aperture facilitates control of ion beam properties including the size and shape of the ion beam, particularly the ion beam cross-section that impacts the substrate, as well as the angle(s) of incidence of ions that impact the substrate. When used in conjunction with species designed to promote reactive ion etching, this configuration enables a novel "directional reactive ion etching" process in which reactive ion etching can be restricted to desired features on a substrate surface without affecting other features.

Figure 1B:
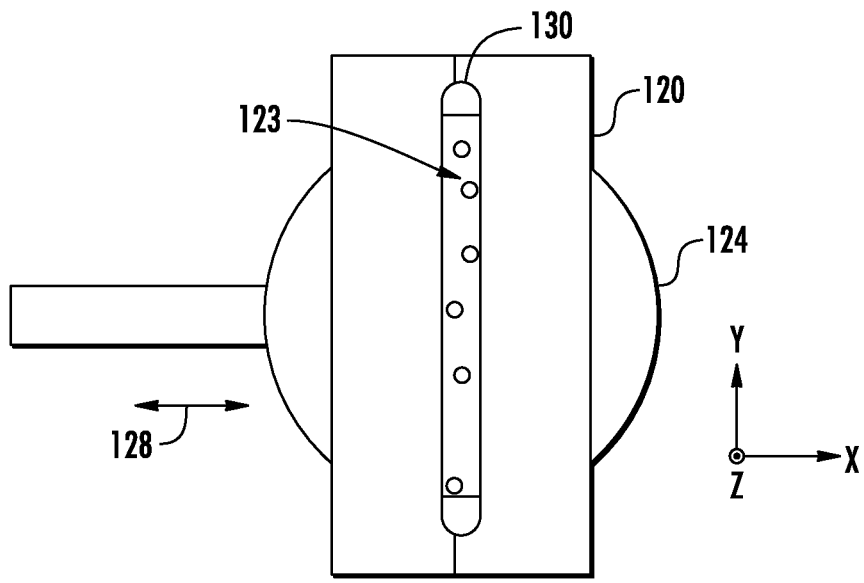
FIG. 1B presents a top view showing the relative placement of an aperture and substrate of the processing system of FIG. 1A.

FIG. 1A presents a schematic and block diagram in side view of a processing system 100 consistent with various embodiments. FIG. 1B presents a top view showing the relative placement of an aperture of the processing system 100 with respect to a substrate 124.

The processing system 100 includes a plasma source 102 that includes a plasma chamber 104 to contain a plasma 106. The plasma chamber 104 may be said to generate the plasma 106, although it will be understood that the plasma 106 is generated when power and the appropriate gaseous species are provided to the plasma chamber 104. A gas source 114 is connected to the plasma source 102 and more particularly to the plasma chamber 104 to provide gaseous species for generating a plasma. The gas source 114 may represent multiple independent gas sources in some embodiments.

The plasma source 102 or other components of the processing system 100 also may be connected to a pump (not shown), such as a turbopump. The plasma source 102 that generates the plasma 106 may be, for example, an RF plasma source, inductively-coupled plasma (ICP) source, a capacitively-coupled plasma (CCP) source, an indirectly heated cathode (IHC), or other plasma sources known to those skilled in the art. In some embodiments, the plasma source 102 is an RF plasma source having a power supply 108 and an RF inductor 112 to generate an inductively couple plasma. In some embodiments a matching network for capacitive coupling may be included. In some embodiments, a plasma source such as the plasma source 102 is surrounded by an enclosure 110.

Adjacent the plasma chamber 104 is a process chamber 116 that houses the substrate 124 during substrate processing. An insulator 118 may be provided to electrically isolate the enclosure 110 and various components therein from the process chamber 116. An extraction plate 120 is provided to extract ions 122 from the plasma 106 and direct the ions 122 to the substrate 124. The process chamber 116 includes a substrate platen 126 that is configured to support the substrate 124. The substrate platen 126 may be connected to a drive mechanism (not shown) so that the substrate platen 126 may move along one or more of the directions X-, Y- and –Z directions of the Cartesian coordinate system shown. As also shown in FIG. 1B, in some embodiments the substrate platen 126 may move along the direction 128 parallel to the X-direction so that scanning of the substrate 124 takes place with respect to the extraction aperture 130. In various embodiments, the extraction aperture 130 may be an elongated extraction aperture having a longer dimension along the Y-direction as opposed to the X-direction. In this configuration, the substrate 124 may be scanned along the X-direction, direction 128 in order to expose the entirety of substrate 124 to ions extracted from the plasma 106. However, in other embodiments, an extraction aperture may have different shapes, or an extraction plate may include multiple extraction apertures. The embodiments are not limited in this context.

As shown in FIG. 1A, the positioning of the extraction plate 120 with the extraction aperture 130 may generate a plasma sheath boundary 132 that has a curvature. In the embodiment shown, the plasma sheath boundary 132 has a concave shape with respect to a plane 134 of the substrate 124, and with respect to a plane 136 of the extraction plate 120. This curvature results in the extraction of ions from the plasma 106 at the plasma sheath boundary 132 in which ion trajectories may deviate from a perpendicular incidence with respect to the plane 134. By varying plasma-processing conditions of the processing system 100, the shape of the plasma sheath boundary may be varied. In addition, the shape and relative orientation of an extraction aperture with respect to the substrate 124 may be controlled. In addition the separation S of the extraction plate 120 with respect to the plane 134 of substrate 124 may be varied. This may allow control of the directionality or angle of incidence of ions with respect to features on a substrate to be processed. As illustrated in FIG. 1A, ions may be directed over a range of angles 125 with respect to the substrate 124. When reactive species 123 are provided to the substrate 124, this control of ion directionality may thus facilitate selectively etching or processing surfaces within a substrate having particular orientations while not etching or processing surfaces in other orientations.

Moreover, as described herein, various embodiments provide a novel extraction system to generate ion beams from the plasma and control their ion angular distribution (IAD). The term "ion angular distribution" refers to the mean angle of incidence of ions in an ion beam with respect to a reference direction such a perpendicular to a substrate, as well as to the width of distribution or range of angles of incidence centered around the mean angle, termed "angular spread" for short. In the embodiments disclosed herein the novel extraction system may include an extraction plate located adjacent a plasma and containing at least one aperture to extract ions from the plasma and accelerate ions toward a substrate based on electrical potential difference between the plasma and the substrate. The extraction system may also include a beam blocker that is located proximate the aperture of the extraction plate and that serves to generate two ion beams. As detailed below, the angle of incidence of ion beams may be controlled by control of parameters such as aperture width, plasma power, gas pressure, extraction voltage applied between plasma chamber and substrate, and other parameters. Variation of these parameters may change the exact shape of the meniscus thus the angle or range of angles of ions extracted from a plasma, with respect to a reference direction such as a perpendicular to a plane of a substrate.

Advantages afforded by the embodiments generally illustrated in FIG. 1A and FIG. 1B include the high current density comparable to that of conventional high current beamline implanters. Further advantageous effects of the processing apparatus of the present embodiments include the degree of repeatability of a process for providing angled ions to a substrate in terms of both ion beam current uniformity provided to the substrate as well as control of ion beam angle. Each of these parameters may be controlled to a degree comparable to that afforded by conventional beamline ion implantation apparatus, with the added advantageous effect that angled ions may be provided to a substrate at a desired angle of incidence or range of angles of incidence without having to tilt a substrate.

In particular, with reference to FIGS. 1A and 1B, angled ions whose angle of incidence form a non-zero angle with respect to a perpendicular to plane 134, that is, the Z-axis, may be directed to the substrate 124 without tilting of the substrate 124 about the perpendicular. In one example, this allows the substrate 124 to lie parallel to a plane of the extraction plate 120, where both substrate 124 and extraction plate 120 lie parallel to the X-Y plane shown. This allows angled trenches or other angled cavities to be formed within substrate 124 at a non-zero angle of inclination with respect to a perpendicular to plane 134 even if the separation S is very small. For example, the substrate 124 may have dimensions that extend for hundreds of millimeters along directions parallel to the X-axis and Y-axis, but may be placed adjacent the extraction plate 120 such that S is equal to 10 mm in one example. At the same time ions may be directed to the substrate 124 at an angle of incidence of 45 degrees with respect to perpendicular to plane 134, thus forming trenches with a similar angle of inclination within a layer, as discussed below. Such structures may not be formed by conventional apparatus in which ions may be directed to a substrate along the perpendicular. To form angled trenches having a 45 degree angle of inclination using such conventional apparatus, tilting of the substrate at a 45 degree angle with respect to perpendicular would be required, which would not be possible, for example, in the case of a 300 mm diameter wafer disposed at a separation of 10 mm adjacent a conventional extraction assembly that extracts ions from a plasma at perpendicular incidence with respect to the plane of the substrate.

Moreover, as detailed below, processing apparatus of the present embodiments provide angled reactive ion etching in a manner that is not achievable by beamline implanters, conventional reactive ion etching equipment, or other conventional ion beam or plasma apparatus. This facilitates the ability to fabricate angled trenches with a great deal of control to meet the specifications for novel device fabrication as detailed herein.

Figure 2:
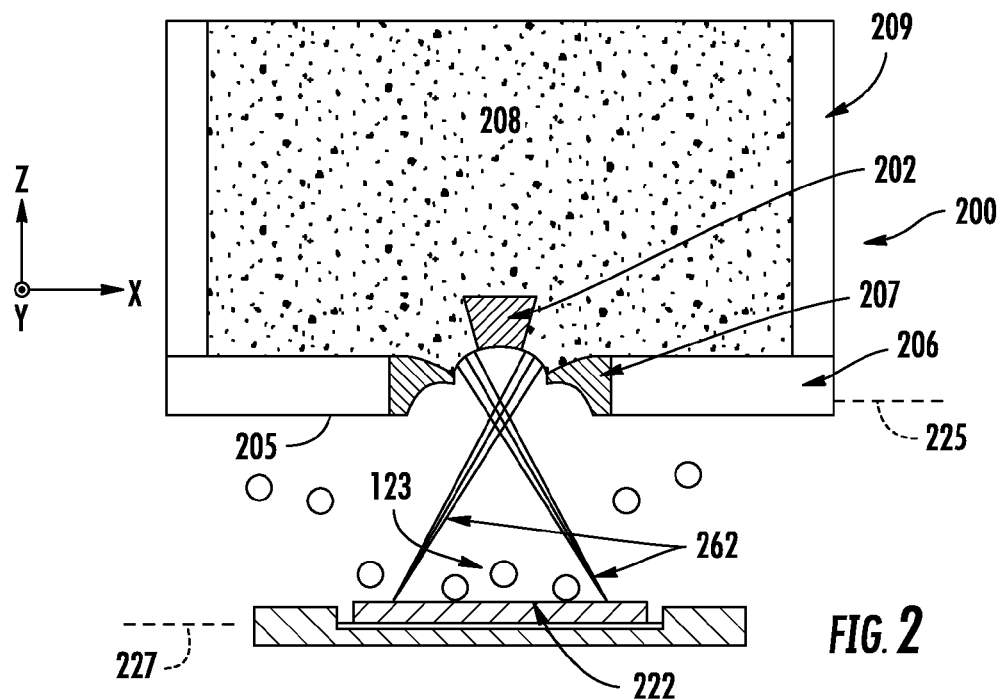
FIG. 2 schematically depicts an operation scenario for extraction geometry of a processing system according to one aspect of the present disclosure.

FIG. 2 depicts one operation scenario for a processing apparatus 200 that includes a beam blocker 202 consistent with further embodiments of the disclosure. The processing apparatus 200 may include similar components as those shown in FIG. 1A, which are omitted for clarity. In the embodiment depicted in FIG. 2 the beam blocker 202 is disposed proximate an aperture 204 defined by an extraction plate 205. The extraction plate 205 may be a flat structure similar to extraction plate 120 that is defined by a plane 225 parallel to the X-Y plane. The extraction plate 205 may, but need not, be composed of an inner part 206 and outer part 207. The operation scenario for processing apparatus 200 in FIG. 2 may correspond to a first set of conditions, which may include a combination of plasma power, gas pressure, extraction voltage, and so forth.

Figure 3:
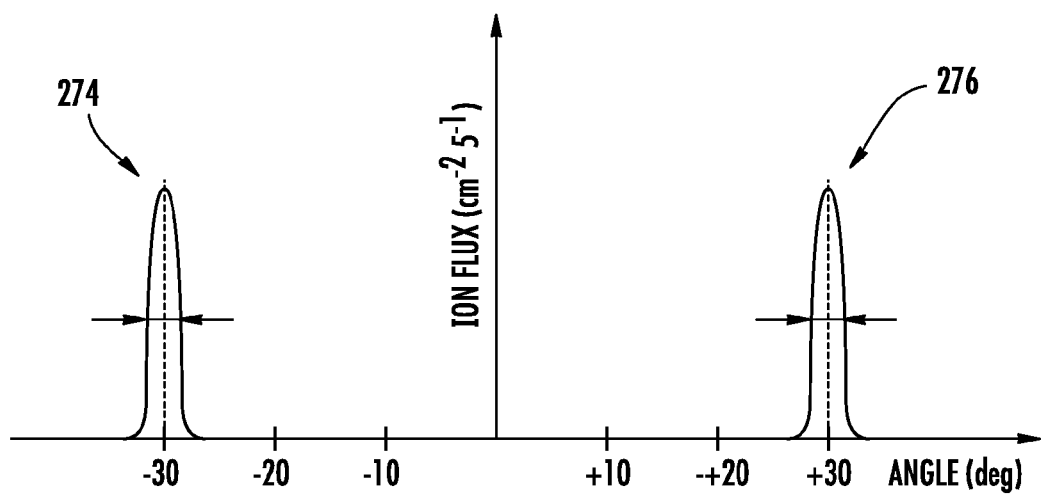
FIG. 3 depicts one example of ion angular distribution.

When a plasma 208 is generated in a plasma chamber 209 and an extraction voltage is applied between the plasma chamber 209 and substrate 222 a pair of ion beams 262 are extracted from the plasma 208. In some examples, the extraction voltage may be 0.5 kV to 2.0 kV; however, the embodiments are not limited in this regard. For simplicity it may be assumed that ions within each of the ion beams 262 form a same mean angle with respect to perpendicular to the substrate 222 and form the same angular range of angles of incidence, where a mean angle is defined by the absolute value of the angle with respect to perpendicular unless otherwise noted. Thus an angle (+)θ with respect to perpendicular (the Z-axis direction) and an angle −θ with respect to perpendicular may be deemed to constitute the same mean angle. FIG. 3 presents exemplary symmetrical ion angular distributions 274, 276 which may represent the angular distributions of the pair of ion beams 262. As illustrated, the mean angle of ion beams 262 is +/−30 degrees with respect to perpendicular (Z axis) to a plane 227 of the substrate. The angular distribution depicted in FIG. 3 is merely for exemplification purposes and is shown as a Gaussian shape. For this type of distribution the angular spread may be defined simply as the full width at half maximum (FWHM), which in this case is approximately 2 degrees. However, in other embodiments an ion beam may be provided with an ion angular distribution having an FWHM of 5 degrees, 10 degrees, or other value. In practice the ion angular distribution may have a much more complex shape, and depending of the extraction optics geometry, might be skewed toward lower or higher angles. For distributions different than Gaussian distribution, the angular spread may be defined as half of the difference between the maximum and minimum angles of a particular beamlet.

Consistent with various embodiments, the variation in beam IAD characteristics (mean angle and angular spread) exhibited between the ion beams 262 may be generated by changing any combination of various parameters. The variation in beam geometry may be achievable without breaking vacuum of a processing apparatus. For this reason the present embodiments facilitate what is termed in-situ control of ion mean incidence angle, angular spread, in other words Ion Angular Distribution (IAD), of ions provided to a substrate. According to various embodiments in situ variation of ion angular distribution may be generated by changes in position of the beam blocker 202; variation in aperture size; changes in RF power delivered to the plasma 208; changes of the gas pressure; or changes in extraction voltage between plasma chamber 209 and substrate 222, among other factors The control of ion angular distribution of an ion beam directed to the substrate that is afforded by the aforementioned apparatus may be used in conjunction with provision of a reactive gas to generate a directional or angled reactive ion etching process that is effective to etch angled trenches, vias or other structures in a layer such as an oxide or nitride. By providing a reactive ion etching process, such angled cavities may be fabricated in a selective manner that removes material in a desired layer without undue damage to an underlying layer such as silicon. Moreover, apparatus, such as substrate platen 126 may be heatable up to 700° C. in order to tailor a reactive ion etching process according to the material(s) to be etched. Further details of directional reactive ion etching processes are provided below with respect to FIGS. 7A and 7B. In brief, however, in various embodiments this allows the fabrication of angled cavities in a host layer that may serve to define the width, height, and angle of heteroepitaxially grown semiconductor structures in a manner that reduces defect formation. The term "angled cavity" as used herein refers to angled trenches, angled vias, or angled holes having other shapes. An angled cavity may form a non-zero angle of inclination with respect to a perpendicular to a substrate plane. As detailed below, after formation, the angled cavities may be filled with semiconductor material that is grown in a heteroepitaxial manner to form an angled structure used to form a final device that provides superior properties in comparison to conventional devices. An "angled structure" may refer to any type of crystalline material, such as a heteroepitaxial crystalline material, grown on another crystalline material within the angled cavity.

In particular, according to embodiments of the present disclosure, angled reactive ion etching may be used to generate sidewalls of high aspect ratio trenches that are tilted or angled to allow defects in crystalline material formed in the high aspect ratio trenches to be terminated in the tilted sidewalls, including defects propagating along the length of the high aspect ratio trenches. Embodiment of the present disclosure may be used to reduce defects in any crystalline films formed by heteroepitaxy. For example, embodiments of the present disclosure may be used to reduce defects in heteroepitaxial growth on silicon (Si) for microelectronic applications, such as high mobility channels using Group III-V elements in field effect transistors. Embodiments of the present disclosure may also be used in forming other epitaxial films, such as gallium nitride (GaN) films formed on sapphire, aluminum gallium indium phosphide (AlGaInP) film formed on gallium arsenide (GaAs) or diamond or iridium.

The use of directed reactive ion etching of the present embodiments to form angled cavities for growing heteroepitaxial device structures affords the ability to fabricate devices not fabricated by other techniques. For example, the ion angular distribution of angled ions may be adjusted to generate an angle of incidence greater than 45 degrees with respect to perpendicular to a substrate plane, such as 45 degrees to 60 degrees. This may result in the fabrication of an angled trench having a similar angle of inclination with respect to the substrate plane.

Moreover the precise control of ion angular distribution afforded by the present embodiments facilitates fine control of the angle of inclination of angled cavities such as angled trenches or angled vias. This may be useful to tailor the angle of inclination of a trench or via according to the device structure being grown. For example, if heteroepitaxial growth is performed on a given surface of a crystalline silicon substrate, dislocations such as threading dislocations may form along certain directions or angles of inclination with respect to the crystallographic planes of the silicon substrate. In one example the silicon substrate may be a silicon {100} substrate, in which a plane (wafer surface) of the silicon substrate is parallel to the (100) crystallographic plane. In this case, when a second material is heteroepitaxially grown on the silicon surface, certain type of threading dislocations may develop and propagate along a direction that forms an angle of 55 degrees with respect to a plane of the silicon substrate. Accordingly, if the second material were grown angled cavities such as in angled trenches having sidewalls oriented at 55 degrees, these angled trenches may not provide sufficient aspect ratio trapping. This is because such dislocations may propagate along directions parallel to the sidewalls and thus fail to terminate until reaching an upper surface of the heteroepitaxial layer. It may therefore be desirable to form trenches or vias whose angle of inclination does not form a 55 degree angle with respect to a plane of the silicon substrate. Thus, in order to intercept such threading dislocations a trench may be provided at an appropriate angle of inclination. This angle of inclination may be in the range of 30 degrees to 50 degrees with respect to a plane of the substrate, such as 45 degrees with respect to a plane of the substrate, or with respect to a perpendicular to the plane.

In other embodiments, the angle of inclination of angled trenches or angled vias or other angled cavities may be tailored to ensure termination of other types of dislocations that propagate along other directions with respect to a plane of a substrate.

Figure 4A:
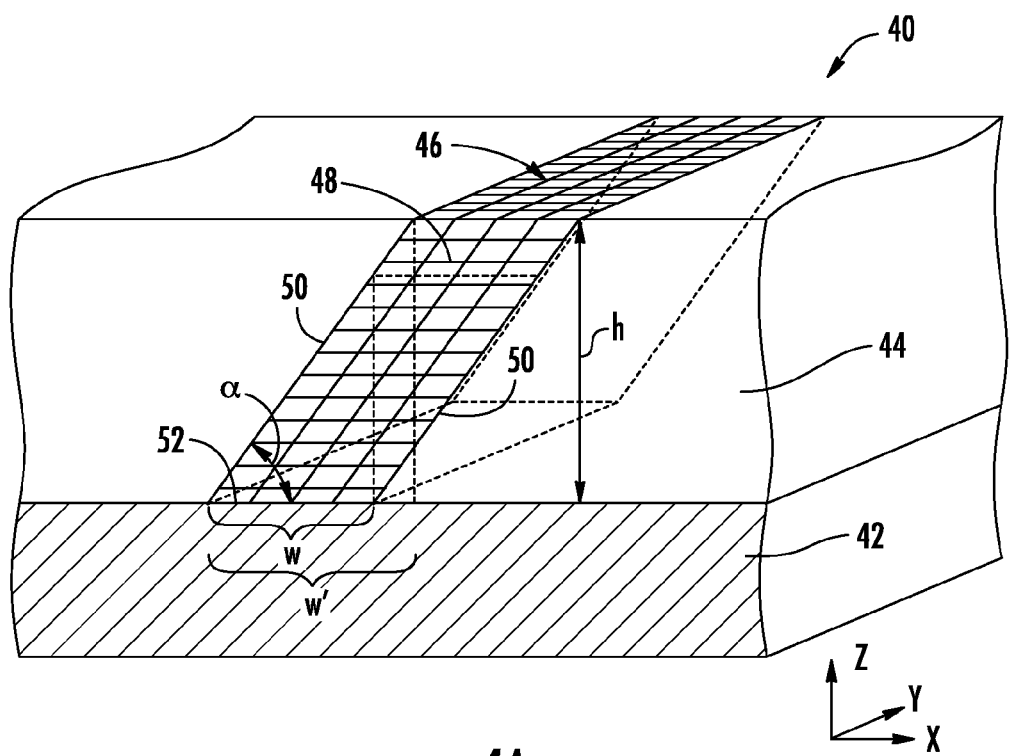
FIG. 4A schematically illustrates an angled trench for heteroepitaxy according one embedment of the present disclosure.

Turning now to FIGS. 4A-E, a more detailed analysis is provided of an angled trench created as described herein. More specifically, angled ions are directed from a plasma in a reactive ambient to the substrate to form an angled trench through the non-crystalline layer that exposes a first crystalline material. The reactive ambient may be provided around the substrate by providing reactive gas to a plasma chamber in one example. Subsequently, the non-crystalline layer may be filled with a second crystalline material, or guest crystalline material that is heteroepitaxially grown on the first crystalline material. FIG. 4A schematically illustrates a structure 40 having an angled trench 46 for heteroepitaxy according one embedment of the present disclosure. As shown, the structure

40 includes a crystalline material 42 having a non-crystalline layer 44 formed thereon. An angled cavity which in this case is an angled trench 46 is formed in the non-crystalline layer 44 to expose a portion of the crystalline material 42. An angled structure composed of a guest crystalline material 48 is formed in the angled trench 46 from the exposed crystalline material 42, and fills the angled trench 46. The guest crystalline material 48 and the crystalline material 42 are different in lattice dimensions. The mismatch of the lattice dimensions between the crystalline material 42 and the guest crystalline material 48 causes defects, such as dislocations, anti-phase boundaries, and stacking faults, to form in the guest crystalline material 48. The angle of inclination α, width w, and height h of the angled trench 46 is selected such that defects initiated from a bottom 52 of the angled trench 46, where the crystalline material 42 interfaces with the guest crystalline material 58, may be terminated on sidewalls 50 of the angled trench 46.

In one embodiment, the angle of inclination α is set so that the defects extending in planes parallel to the x-z plane along the length of the angled trench 46 terminate on the sidewall 50 of the angled trench. Particularly, the angle α, between the sidewall 50 and the x-z plane, and the width w are selected so that a projection w' of the sidewall 50 on the x-y plane is longer than the width 2 of the angled trench 46, $$w \leq w' = \frac{h}{\tan \alpha}$$

or $$\alpha \geq \tan^{-1} \frac{h}{w}.$$

In one embodiment, the aspect ratio, ratio of height over width h/w, is selected so that defects generated from the bottom 212 and prorogating along planes parallel to the x-y plane may terminate on the sidewalls 210.

In one embodiment, the height h of the angled trench 46 may be about 100 nanometer or less. The width w of the angled trench 46 may be between about 20 nanometer to about 40 nanometer. The angle α of the angled trench 46 may be between about 11 degrees to about 45 degrees. In one embodiment, the angle of inclination α of the angled trench 46 may be about 30 degrees.

The crystalline material 42 may be a substrate formed by a crystalline material, or a crystalline layer formed on a substrate. In one embodiment, the crystalline material 42 may be a silicon-containing substrate including germanium (Ge), carbon (C), boron (B), phosphorous (P) or other known elements that may be co-grown, doped, and/or associated with silicon materials.

The non-crystalline layer 44 may a dielectric material including one or more of silicon nitride (SiN), silicon dioxide (SiO$_2$), silicon oxynitride (SiON) or other suitable materials that may be used to form a dielectric layer.

The guest crystalline material 48 may be formed by heteroepitaxy from the exposed crystalline material 42 on the bottom 52 of the angled trench 46. The guest crystalline material 48 may include one of a binary or ternary Group III-V element. The Group III element may include gallium (Ga), aluminum (Al) and indium (In). The Group V element may include nitrogen (N), phosphorus (P), and arsenic (As).

The structure 40 may be used in forming any suitable devices where heteroepitaxy trench material is desired, such as field effect transistors and optoelectronic devices.

In additional embodiments, the etch chemistries are as follows. For SiN etching, the chemistry is a mixture of CH$_3$F/O$_2$. For SiO$_2$ etching, either C$_4$F$_6$ or C$_4$F$_8$ (mixed with O$_2$ or Ar). In a particular embodiment, CF$_4$ based chemistry is used.

The angled trench 46 of the structure 40 may be formed by a directional etching process. In one embodiment, the angled trench 46 may be formed by modifying a shape of a plasma sheath, and extracting ions from the plasma so as to direct an ion beam at a non-zero angle with respect to a perpendicular, that is, the Z-axis.

FIGS. 4B-4E schematically depict formation of a device 400 having a heteroepitaxially grown film in an angled trench according to one embodiment of the present disclosure. In one embodiment, the device 400 may be part of a planar metal-oxide-semiconductor field effect transistor (MOSFET). Alternatively, the device 400 may be part of a FinFET, i.e. a field effect transistor having a thin fin connecting the source and the drain. The channel between the source and drain of MOSFET or the thin fin of FinFET may be formed by heteroepitaxy according to embodiments of the present disclosure.

Figure 4B:
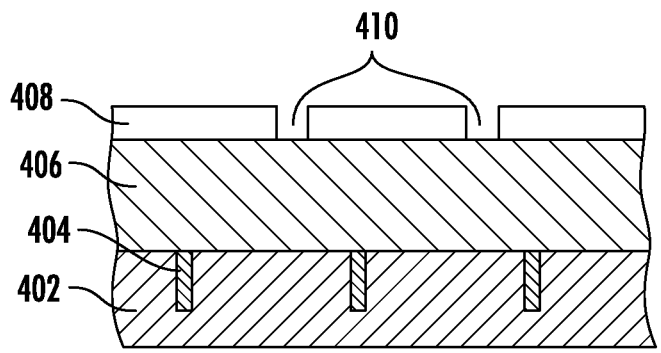
FIGS. 4B-4E schematically depict formation of a device having a heteroepitaxy film in an angled trench according to one embodiment of the present disclosure.

As shown in FIG. 4B, a substrate 402 having a dielectric layer 406 formed thereon. The substrate 402 is formed from a crystalline material. The substrate 402 may be a silicon substrate or a silicon substrate having germanium (Ge), carbon (C), boron (B), phosphorous (P) or other known elements that may be co-grown, doped, and/or associated with silicon materials. In one embodiment, shallow trench isolation 404 (STI) may be formed in the substrate 402 to provide isolation between neighboring devices. The shallow trench isolation 404 may be formed from silicon oxide.

The dielectric layer 406 may include one or more of silicon nitride (SiN), silicon dioxide (SiO$_2$), silicon oxynitride (SiON) or other suitable materials that may be used to form a non-crystalline dielectric layer.

A trench pattern 410 may be formed in a mask layer 408 over the dielectric layer 406. The trench pattern 410 may be used to form angled trenches according to embodiments of the present disclosure. The mask layer 408 may be a photoresist layer or a hardmask layer. The mask layer 408 may be formed from photoresist, silicon oxide, silicon nitride, silicon on glass (SOG), topaz, and other suitable material.

Figure 4C:
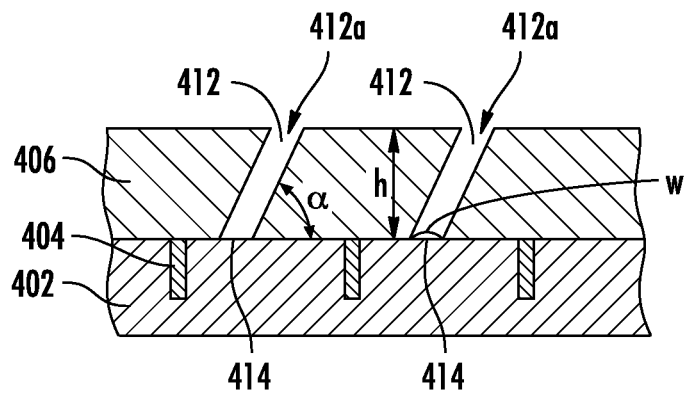

In FIG. 4C, angled trenches 412 are formed through the dielectric layer 406 to expose a portion of the substrate 402 at a bottom surface 414 of the angled trenches 412. The crystalline structure on the bottom surface 414 may serve as seeds for epitaxy growth in the angled trench 412. The mask layer 408 may be removed after formation of the angled trench 412.

The angled trench 412 may be formed by drying etching, for example by apparatus and methods described in FIG. 1A to FIG. 3B above. In one embodiment, a directional reactive ion beam etching may be performed to generate an ion beam that is directed to the substrate 402 to form the angled trench 412. The etch gas may include SF$_6$, C$_3$F$_8$ CF$_4$, BF$_3$, BI$_3$, N$_2$, Ar, PH$_3$, AsH$_3$, B$_2$H$_6$, H$_2$, Xe, Kr, Ne, He, SiH$_4$, SiF$_4$, GeH$_4$, GeF$_4$, CH$_4$, AsF$_5$, PF$_3$, PF$_5$, or combinations thereof.

According to embodiments of the present disclosure, the aspect ratio and the angle α of angled trench 412 are set so that the defects from extending to an upper portion 412*a* of the angled trench 412. In one embodiment, the angle of inclination α is greater than $$\tan^{-1} \frac{h}{w},$$

wherein h is the thickness of the dielectric layer 406 or height of the angled trench 412, and w is width of the angled trench 412. In one embodiment, the height of the angled trench 412 may be about 100 nm or less, and the width w of the angled trench 412 may be between about 20 nanometer to about 40 nanometer. The angle of inclination α of the angled trench 412 may be between about 11 degrees to about 45 degrees. In one embodiment, the angle of inclination α of the angled trench 412 may be about 30 degrees.

It is to be noted that in the examples of FIG. 4A to 4D an angled trench 46 or angled trench 412 may exhibit sidewalls that are mutually parallel to one another. Accordingly, an average angle of inclination of such an angled trench may coincide with an angle of inclination of each sidewall. However, in other embodiments, sidewalls of an angled trench need not be parallel to one another, but may diverge or converge or bow out, such that an average angle of inclination of the angled trench is different that the angle in inclination of a sidewall or sidewalls.

Figure 4D:
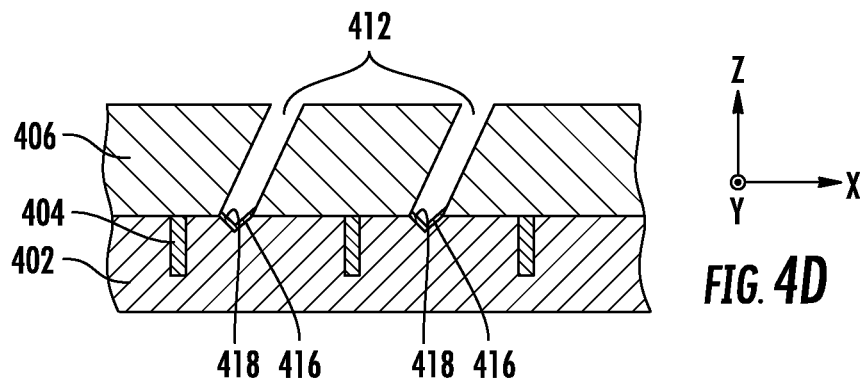

In FIG. 4D, an additional etching may be performed to the substrate 402 to expose surfaces with crystal plane orientation that is more desirable for epitaxial growth. For example, for silicon crystal, the (111) crystal plane orientation has a tighter packing density and are easier to grow. Since most common silicon substrates exhibit a (100) crystal plane orientation, the bottom surface 414 of the angled trench 412 are most likely to have a (100) crystal plane orientation. As shown in FIG. 4D, a v-groove 416 may be etched to the substrate 402 to produce surfaces with a (111) crystal plane orientation. The v-groove 416 may be formed by any suitable etch process, such as wet or dry etch methods, or plasma assisted etching methods.

In one embodiment, a seed layer 418 may be formed on the v-groove 416. The seed layer 418 may include material having the ability to attain good coverage of the v-groove 416 having surfaces with a (111) crystal plane orientation.

In one embodiment, when Group III-V crystalline (e.g., a buffer layer growth) is to be formed in the angled trench 412, the seed layer may include at least one of a Group III element or a Group V element. In one embodiment, the Group III element may include gallium (Ga) or aluminum (Al) and the Group V element may include arsenic (As). One or more Group III or Group V source materials may be used for forming the seed layer 418. The source materials may be metal organic precursors or the like. Exemplary Group III and Group V source materials may include tertiary butyl phosphorous, tertiary butyl arsenic, triethyl antimony, trimethyl antimony, triethyl gallium, trimethyl gallium, triethyl indium, trimethyl indium, indium chloride, indium phosphide, gallium chloride, trimethylaluminum, or organophosphorous compounds. The seed layer 418 may be formed by any suitable deposition method, such as reduced pressure chemical vapor deposition (CVD), epitaxial deposition, or any other suitable deposition method.

Figure 4E:
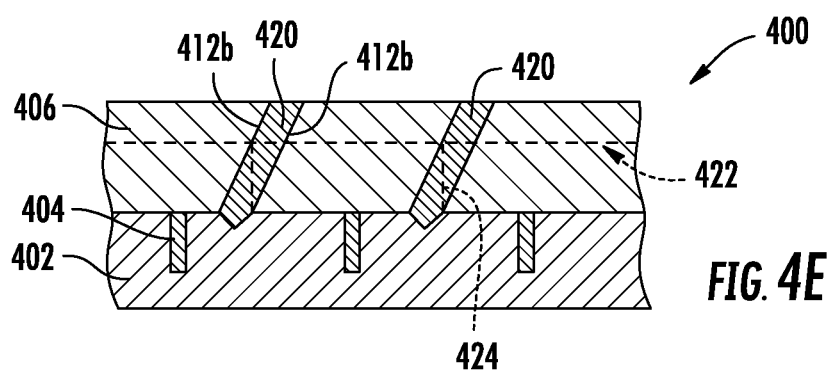

In FIG. 4E, a crystalline material 420 is formed in and fills up the angled trench 412. The crystalline material 420 may be formed by epitaxy deposition. In one embodiment, the crystalline material 420 may include one of a binary or ternary material of a Group III-V material system. In one embodiment, the crystalline material 420 may include indium, gallium, and arsenic.

In one embodiment, the composition of the crystalline material 420 may change during deposition. For example, the molar ratio of the binary or ternary Group III-V elements may be set to reduce defect generation at an early stage of filling the angled trench 412 and set to provide desirable device properties, such as improved mobility, at a later stage of filling the angled trench 412.

As shown in FIG. 4E, vertical line 424 schematically illustrates a direction along which defects caused by the lattice mismatch would prorogate in the plane parallel to length (into the paper) of the angled trench 412. The vertical line 424 intersects with sidewalls of the angled trench 412 indicating that the defects are terminated at the sidewalls 412b of the angled trench 412. Horizontal line 422 indicates the highest level the defects can reach. In other words, the crystalline material 420 above the horizontal line 422 may be free of defects originated from lattice mismatch. In one embodiment, the crystalline material 420 below the horizontal line 422 may include $In_{0.3}Ga_{0.7}As$ (molar ratio) to minimize defects and the crystalline material 420 above the horizontal line 422 may include $In_{0.53}Ga_{0.47}As$ (molar ratio) for improved mobility.

In the embodiment, additional structures may be added to the device 400 so that the crystalline material 420 above the horizontal line 422 functions as the operating region.

Figure 5:
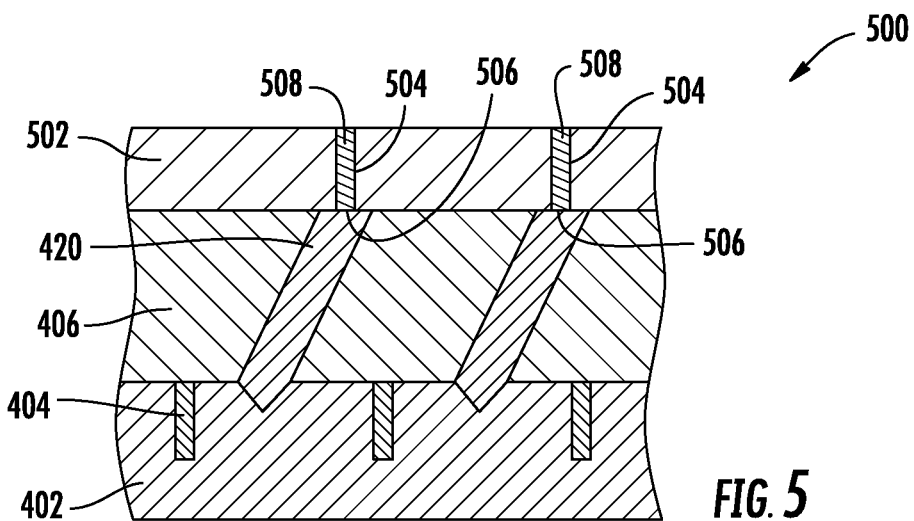
FIG. 5 schematically depicts formation of a replacement epitaxy wire according to one embodiment of the present disclosure.

Alternatively, as shown in FIG. 5, additional crystalline material may be formed from the crystalline material 420 to create operating region for the target device. In the device 500, a dielectric material 502 may be formed over the dielectric layer 406 and the crystalline material 420, probably after a chemical mechanical polishing process. The dielectric material 502 may be silicon oxide, silicon nitride or other suitable material. Narrow trenches 504 may be formed through the dielectric material 502 to expose a portion of the crystalline material 420 at a bottom surface 506. The narrow trenches 504 may be deemed vertical narrow trenches in that they are substantially vertical and aligned with the angled trenches 412. The narrow trenches 504 are narrower than the angled trenches 412. A channel material 508, having the substantially the same lattice dimension as the crystalline material 420, is then formed in the narrow trenches 504 from the crystalline material 420. The channel material 508 may be substantially free of stacking faults, threading dislocations and other defects. In one embodiment, the dielectric material 503 may have a thickness of about 60 nm or less. The narrow trenches 504 may have a width of between about 5 nm to about 10 nm.

Figure 6A:
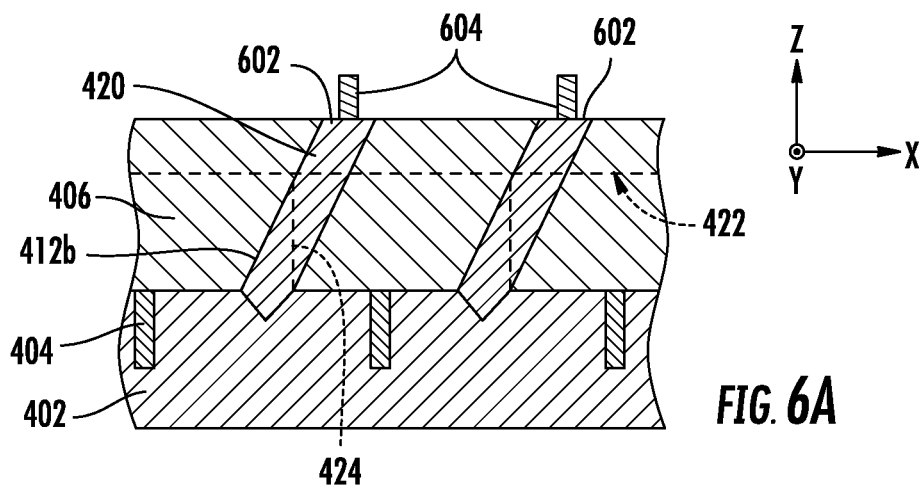
FIGS. 6A-6B schematically depict formation of an epitaxy wire by etching back according to one embodiment of the present disclosure.
Figure 6B:
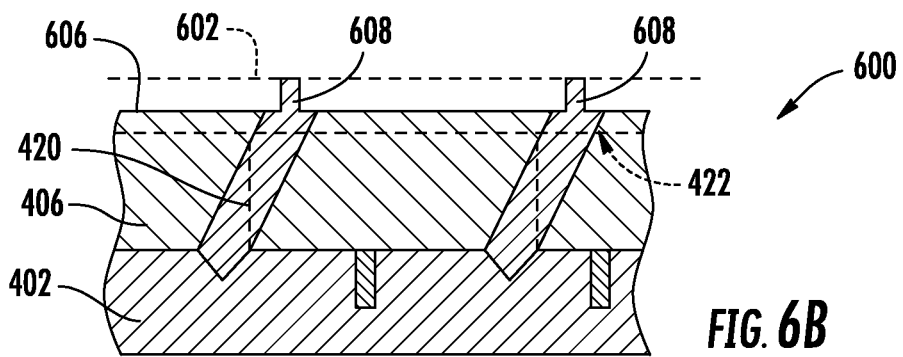

In another embodiment, as shown in FIGS. 6A-6B, channel material may be formed by etching back the crystalline material 420 in the angled trench 412 to form a device 600. Following a chemical mechanical polishing to expose a planar surface 602 of the dielectric layer 406 and the crystalline material 420. A mask 604 overlapping with a narrow stretch of the angled trench 412 may be formed over the planar surface 602.

As shown in FIG. 6B, an etch process performed to form channel material 608 in an upper portion of the crystalline material 420. In this embodiment, an anisotropic wet etch solution, such as sulfuric acid ($H_2SO_4$) and hydrogen peroxide ($H_2O_2$), or citric acid ($C_6H_8O_7$) and hydrogen peroxide ($H_2O_2$), may be provided to the exposed top surface, that is, the planar surface 602. After the etch process, the channel material 608 may extend over a newly exposed planar surface 606. The planar surface 606 may be above the horizontal line 422 so that the channel material 608 is formed from the portion of the crystalline material 420 that is substantially free of defects from lattice mismatch.

Although in principle it may be possible to etch angled cavities in a layer using ion beam etching that involves physical sputter removal of material, the present embodiments extend the ability to etch angled cavities using a broad array of gas mixtures that are used for conventional reactive ion etching (RIE) processing. Thus, in addition to providing ions to a substrate at a chosen angle(s) of incidence, the substrate is simultaneously exposed to reactive species that together with the incident ions generate reactive etching of the substrate as noted above. Thus, the present embodiments include many of the beneficial attributes of conventional RIE such as a broad array of available chemistries from which to select to provide "material selectivity" during etching. The term "material selectivity" as used herein refers to the etching of one material substantially faster than another material. However, the present embodiments provide an additional type of selectivity, directional selectivity, not found in conventional RIE processing or other conventional techniques.

In brief, the term "directional selectivity" as used herein, refers to the quality of enhancing etch rate of surfaces facing a specific direction or set of directions as opposed to surfaces facing other directions. The term "directional reactive ion etching" (directional RIE) as used herein, refers to the processes consistent with the present embodiments that may provide a combination of providing a reactive ambient to a substrate together with ions that are oriented along specific angles of incidence which may be non-perpendicular to the plane of the substrate being processed. Thus, directional RIE may supply a combination of both material etch selectivity and directional etch selectivity during processing.

An additional feature of the present embodiments, unlike conventional RIE, is that the substrate being processed is not immersed in a plasma, but rather the separation of the substrate relative to a plasma source may be varied. This separation may be expressed as a separation S between an extraction plate 120 and plane 134 of a substrate 124, as noted above. This allows control of various features including allowing the gas pressure at the substrate surface to be controlled independently of the gas pressure within the plasma chamber. Thus, gas pressure may be varied at the substrate 124 to adjust the etching environment for etching angled trenches without having to adjust gas pressure in a plasma chamber 104.

For example, the gas pressure in the plasma chamber may be held constant while gas pressure at the substrate may be varied from a first gas pressure at a first separation $S_1$ to a second gas pressure at a second separation $S_2$, In other words, a first plasma chamber gas pressure within the plasma chamber at the first separation may be equal to a second plasma chamber gas pressure within the plasma chamber at the second separation.

Because of this decoupling of gas pressure in a plasma chamber and substrate chamber, substrate processing may take place over a continuum. At one end of the continuum etching substrate etching is based on a highly chemically-driven etch process, which may be varied to an ion beam assisted chemical etch process and to a physical (sputter) etch process as the substrate is moved away from the plasma chamber.

For example, the combination of angled ions and reactive ambient directed to a substrate may provide a first degree of physical etching of a layer such as a non-crystalline layer when the substrate is arranged at the first separation. The angled ions and reactive ambient may provide a second degree of physical etching that is greater than the first degree when the substrate is arranged at the second separation. This may be used to tailor the etch process used to form angled trenches or other structures from a more physical sputter etch process to a more chemically-driven process, depending on the structure to be formed.

For purposes of illustration, in one particular example, plasma chamber pressure may be set at 10 mTorr. When a substrate is maintained at a distance of 6 mm, for example, from an extraction plate, the gas pressure surrounding the substrate may be similar to that in the plasma chamber. In this example, when an ion beam is extracted from the extraction plate, etching of the substrate may have a very strong chemical component due to an abundance of reactive species at the relatively high 6 mTorr pressure that may surround the substrate. Using known gas chemistry, a highly anisotropic etch may be performed as in conventional RIE. However, unlike conventional RIE which may generate vertical trenches, angled trenches may be formed by anisotropic etching along the angle of incidence of the extracted ion beam. It is to be noted that when the substrate is maintained at a close distance, it is also possible to adjust the composition of plasma species to generate isotropic etching instead of anisotropic etching. For example, the plasma conditions may be adjusted to generate neutral radicals that play a dominant role in chemical etching such that any extracted ions have a negligible effect on etching of the trenches.

Continuing with the above scenario in which plasma chamber pressure is 10 mTorr, when the substrate is increased to a separation, of, for example, greater than 20 mm, the pressure at the substrate may drop to a range of 1E-4 to 1E-6 Torr. Under this circumstance, the flux of reactive species such as neutral radical species form the plasma chamber is much lower than when the separation S is 6 mm. However, the ion flux may be maintained at a relatively high level, such that ion beam etching by physical etching (sputtering) dominates the etch process for forming trenches. Thus, as the separation S of a substrate is increased from a first separation to a second separation the degree of physical etching may be increased from a first degree of physical etching to a second degree of physical etching.

Figure 7A:
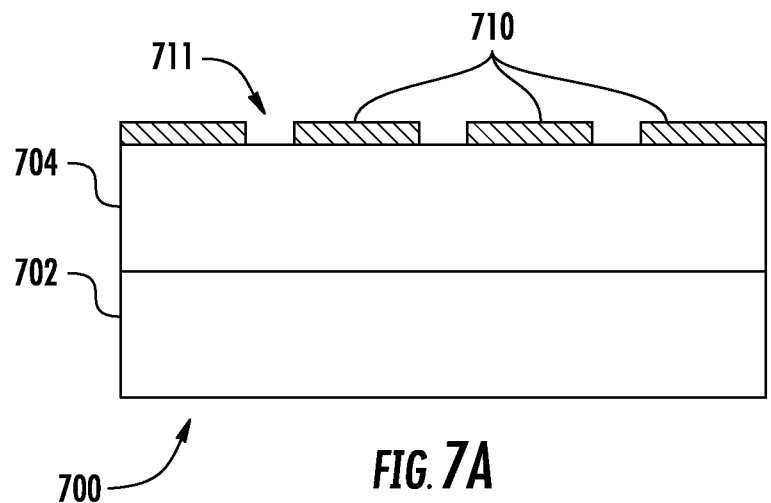
FIG. 7A schematically depicts an example of a substrate structure for processing using angled reactive ion etching.

In order to fabricate angled vias or angled trenches for growing heteroepitaxial structures, a first mask material layer is disposed on an underlying layer in which the angled vias or angled trenches are to be formed. The mask is etched to the top of the underlying layer in patterned regions in which the angled vias or angled trenches are to be formed. The outer surface of the substrate is thus defined by the mask material in first regions, and by the underlying layer in the patterned regions. The etching process to define the underlying patterned regions as shown in FIGS. 4B and 7A below may be performed by a conventional etching process, such as conventional reactive ion etching. Angled reactive ion etching is subsequently performed in a manner that selectively etches the underlying layer faster than the mask layer in order to form the vias or trenches. This may be useful to form the aforementioned low defect heteroepitaxial device structures that are not possible to fabricate using conventional patterning and RIE etching that forms vertically oriented vias or trenches.

To illustrate this process, FIG. 7A depicts an example of a substrate 700 that includes a base layer 702 and intermediate layer 704. The base layer 702 may be composed of a first crystalline material such as silicon or another semiconductor. The intermediate layer 704 may be a non-crystalline layer, and may be composed of an oxide or nitride or other dielectric layer in some embodiments. A mask layer 710 is formed on the intermediate layer 704, and a series of surface features such as holes 711 etched into the mask layer 710 to contact the intermediate layer 704, as shown in FIG. 7A.

Figure 7B:
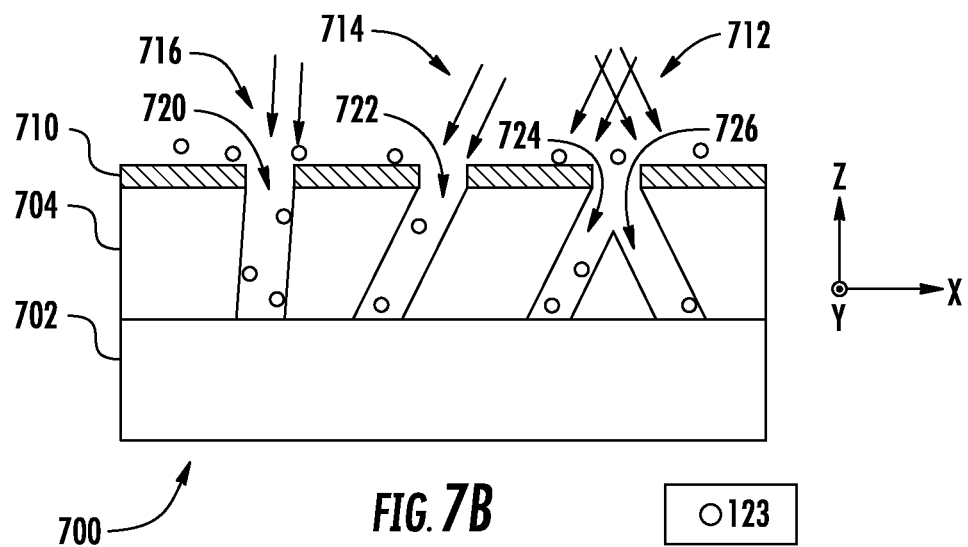
FIG. 7B schematically depicts a reactive ion etching process applied to the substrate of FIG. 7A using ions that are provided at non-perpendicular incidence.

Subsequently, a directional reactive ion etching process is performed using ions that are provided at non-perpendicular incidence, so as to form a non-zero angle with respect to the Z-direction as shown in FIG. 7B. For the purposes of concision, a series of three different exemplary ion angular distributions, in particular, the ion angular distributions 712, 714, and 716 are illustrated together, although it may be appreciated that in some examples just one of the ion angular distributions may be provided to a substrate at a given instance.

Referring again to FIGS. 2A and 3A, the exemplary ion distributions may be generated by varying a set of conditions in the processing apparatus 200. Trenches that are oriented along a single direction may be formed by extracting a single ion beam from a plasma chamber, which may be accomplished, for example, by blocking one side of an aperture with a beam blocker 202, or by providing portions of an extraction plate at different levels, as shown in FIG. 1A.

In some embodiments, reactive ion etching conditions are chosen so as to confer a high degree of materials etch selectivity such that the intermediate layer 704 etches at least 5 times faster than mask layer 710. For example, a reactive ambient may be provided around a substrate 700 either by providing reactive species 123 such as reactive gas to a substrate chamber or providing reactive species within a plasma chamber that stream through an extraction aperture used to direct ions to the substrate 700. Accordingly, angled cavities such as deep vias or deep trenches may be etched into the intermediate layer 704 while the mask layer 710 remains intact. Because the ions are provided at an angle with respect to perpendicular, however, the angle of inclination of vias and trenches is not vertical (parallel to the Z-direction). Rather the angle of inclination is parallel to the direction(s) or incidence angle(s) of the ion angular distributions 712, 714, or 716. Since reactive ion etching creates volatile etch products that are removed in the gas phase, material removed from the angled cavities 720, 722, 724, or 726 during reactive etching is not redeposited, thus allowing the trenches or to be formed with large aspect ratios. As shown in FIG. 7B, the angled cavities 720-726 extend to the top of base layer 702. Subsequently, the angled cavities 722, 724, and 726 may be filled with a heteroepitaxially grown semiconductor material that differs from the semiconductor material of base layer 702. Thus, the ability to form angled vias or angled trenches facilitates forming angled structures composed of heteroepitaxial material that have a geometrical structure that improves aspect ratio trapping of defects. This is accomplished by virtue of the angle (with respect to the Z-axis) of angled cavities 722, 724, 726, used to define angled structures. This feature of the present embodiments may facilitate improved device properties of devices having at least one hetereoepitaxially grown feature, such as a transistor channel in a field effect transistor.

It is to be noted that the ion angular distributions 712, 714, 716 are illustrated as a group of parallel trajectories, such representation is provided for the purposes of simplicity. As noted above, an ion angular distribution may include ion trajectories distributed over a range of angles of incidence that are centered around an average angle of incidence, which may define an average trench angle of inclination. In addition to providing angled trenches having sidewalls that may be parallel to one another, in other embodiments, the trenches may have a concave or convex shaped rather than parallel sidewalls. In particular, the angled trench may have one trench more narrow on one side as compared to the other side, or the sidewalls may be bowed inwardly or outwardly. In one embodiment, the angled trench may exhibit rounded corners near a mask layer 710 due to the etch angle In one embodiment, a preferred angled trench is etched to a 30 degree angle having a width of 12 nanometers (nm), and a depth of 60 nm. In one embodiment, the angled trench is angled such that the bottom portion of the angled trench is unobservable from the top portion or top aperture of the trench.

As illustrated above, using ions extracted from a plasma source, or more specifically, the high aspect ratio trenches are created using the ions extracted from the plasma source. The reactive etching of the substrates entail the use of directional ions to achieve directional reactive etching of substrates including patterned features on a substrate surface, and in particular angled ions where the angled ions form a non-zero angle with respect to a perpendicular to a plane of the substrate.

To summarize, various embodiments disclosed herein provide advantages over conventional etching processes by generating a directional reactive ion etching process. In particular, the directional reactive ion etching process provides ion assisted reactive etching of surfaces using angled ions that are incident at non-zero angle(s) with respect to a perpendicular to the substrate without tilting of the substrate. This type of angled directional etching is not accomplished by conventional reactive ion etching or ion beam etching processes. Additionally, various embodiments disclosed herein provide for changing between a predominantly chemical etch, to an ion-assisted chemical etch, to predominatly physical (sputter) etch within a single process chamber.

Having illustrated the various directional reactive ion etching described herein, once the angled trench of suitable geometry can be achieved (e.g., using angled chemically assisted ion beam etching), it is possible to generate structures in vertical stacking where trenches end up with suitable bottom profiles, to perform ART epitaxial growth and then have a vertical trench aligned with this angled trench such that at the top of the vertical trench, most if not all of the stacking faults and threading dislocations, as well as anti-phase boundaries (APBs), have been terminated at a surface.

In some examples in which an angled trench is not formed from an SiOx layer, it is possible to form a sacrificial material to act as a template for the oxide (i.e., first material may be chosen for optimal etching, etc.).

Figure 8:
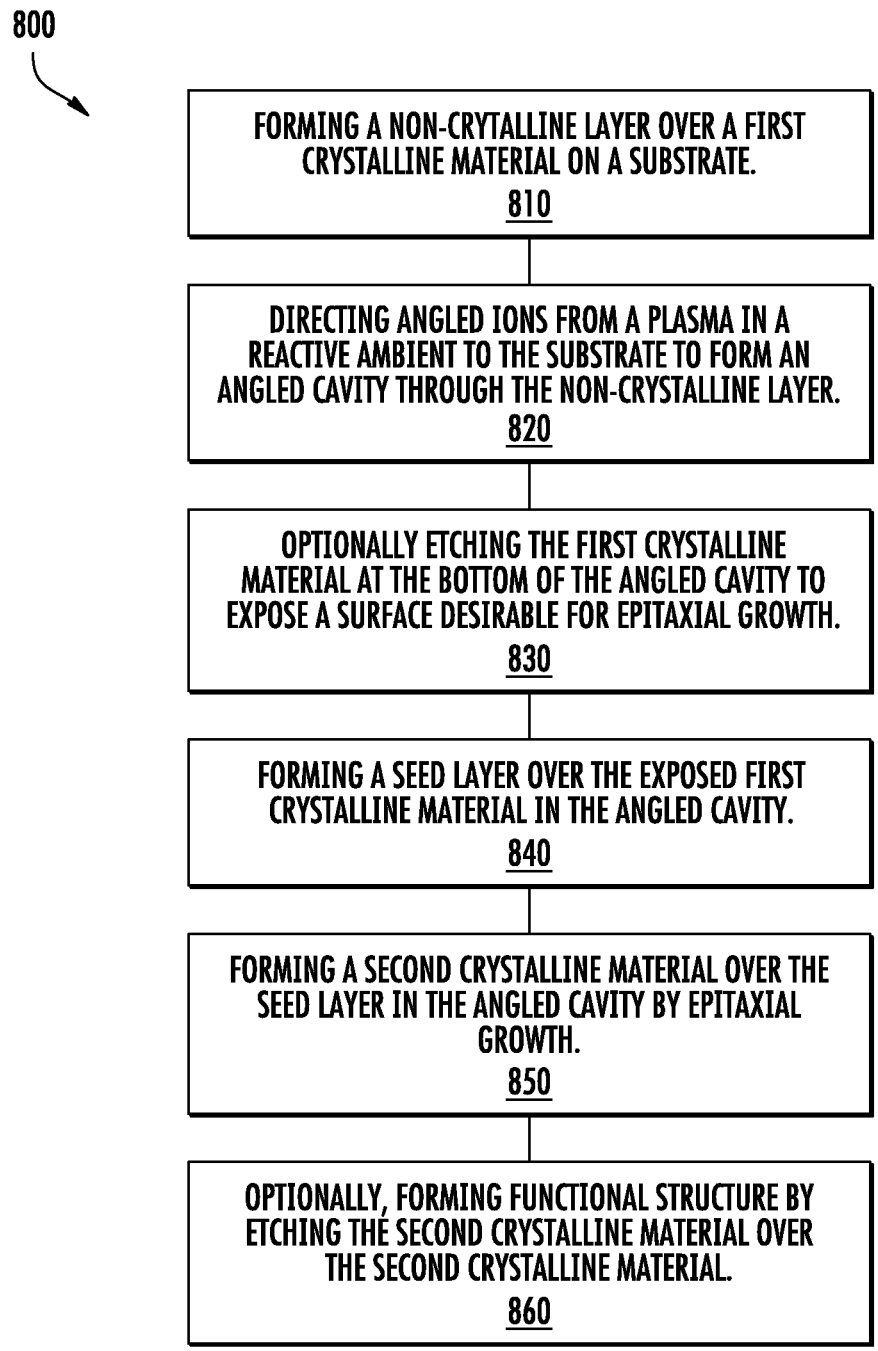
FIG. 8 is a flow chart of a method of heteroepitaxy growth according to one embodiment of the present disclosure.

FIG. 8 is a flow chart of a method 800 for heteroepitaxial growth according to one embodiment of the present disclosure. The method 800 may be used to form devices including angled trenches or other angled cavities according to the present disclosure.

In box 810, a non-crystalline layer may be formed over a first crystalline material. The first crystalline material may be a crystalline substrate or a crystalline layer on a substrate. For example, as shown in FIG. 4, the non-crystalline layer 44 is formed on the crystalline material 42. In one embodiment, the first crystalline material may be silicon or doped silicon, and the non-crystalline material may be a dielectric material.

In box 820, angled ions are directed from a plasma in a reactive ambient to the substrate to form an angled cavity through the non-crystalline layer, where angled ions refers to ions having an angle of incidence that forms a non-zero angle with respect to a perpendicular to a plane of the substrate. In one embodiment, the angled cavity may be formed by an angled ion beam generated by modifying a plasma sheath as shown in FIGS. 1A-3B, for example. For example, as shown in FIG. 4, an angled trench 46 is formed in the non-crystalline layer 44. The angled trench provides boundaries for crystalline growth, such as epitaxial growth, from the exposed portion of the first crystalline material. The angle of inclination of the angled trench is set so that defects, that are originated from the bottom of the angled trench during crystal growth and propagate along the planes in the length of the angled trench, would terminate at the tilted non-crystalline sidewalls of the angled trench. In one embodiment, a projection of the sidewall of the angled trench on a top surface of the first crystalline material is longer than the bottom of angled trench. Additionally, the angled trench may be a narrow trench with a high aspect ratio so that defects, that are originated from the bottom of the angled trench and propagate in planes along a width of the angled trench, would terminate at the sidewalls of the angled trench.

In box 830, an optional etching may be performed to the bottom of the angled cavity to expose a surface in the first crystalline material that is desirable for crystalline growth. For example, as shown in FIG. 4D, a v-groove may be formed in the bottom of the angled cavity to expose crystal surfaces with (111) crystal plane orientation. A wet etching method may be used to perform the optional etching.

In box 840, a seed layer may be formed from the bottom surface of the angled cavity for further epitaxial growth. The seed layer may include material having the ability to attain good coverage of the exposed surface of the first crystalline material.

In box 850, a second crystalline material may be formed in the angled cavity by epitaxial growth. In one embodiment, the first and second crystalline materials have different lattice dimensions and defects may generate in the second crystalline material during formation because of the lattice mismatch. As discussed in box 820, the sidewalls of the angled cavity are positioned to catch and terminate defects caused by lattice mismatch. As a result, the second crystalline material near a top portion of the angled cavity is substantially defect free, thus, desirable for use as a functional structure, such as a fin in FinFET, or in other semiconductor devices.

Optionally, a functional structure may be formed by additional process from the second crystalline material in the angled cavity as described in box 850. In box 860, a functional structure may be formed by either etching the second crystalline material or depositing a third crystalline material over the second crystalline material. In one embodiment, the functional structure may be a vertical fin or nano wire that is narrower than the second crystalline material in the angled cavity to provide desirable function in the target device. In one embodiment, the top portion of the second crystalline material may be etched back to form the narrower functional structure, for example as shown in FIGS. 6A-6B. In another embodiment, a narrower vertical trench may be formed over the second crystalline material. A third crystalline material is subsequently formed in the narrower vertical trench as the functional structure, for example as shown in FIG. 5.

Even though embodiments of the present disclosure are discussed above in association with manufacturing epitaxial fins in FinFET, embodiments of the present disclosure may be used to form any applicable structures in any suitable devices. For example, embodiments of the present disclosure may be used for forming nanowire—which may be used in next generation devices after FinFETs. Nanowires may be formed using angled aspect ratio trapping according to embodiments discussed above with additional processes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for etching a substrate, comprising:
providing a reactive ambient around the substrate when a non-crystalline layer is disposed over a first crystalline material in the substrate;
generating a plasma in a plasma chamber;
modifying a shape of a plasma sheath boundary of the plasma;
extracting ions from the plasma;
directing the ions to the substrate at a non-zero angle of incidence with respect to a perpendicular to a plane of the substrate, wherein the ions and reactive ambient are effective to form an angled trench through the non-crystalline layer to expose a portion of the first crystalline material at a bottom of the angled trench, the angled trench forming a non-zero angle of inclination with respect to the perpendicular; and
forming a second crystalline material within the angled trench by epitaxial growth, wherein the first crystalline material and second crystalline material have mismatched lattice dimensions.

2. The method of claim 1, further comprising:
forming the second crystalline material from the bottom of the angled trench by epitaxial growth to fill the angled trench wherein defects that form within the second crystalline material terminate at sidewalls of the angled trench.

3. The method of claim 1, wherein the modifying the plasma sheath comprises providing an extraction aperture in an extraction plate that is disposed between the plasma and substrate, the method further comprising providing a beam blocker adjacent the aperture, the beam blocker being effective to direct the ions to the substrate as at least one angled ion beam that forms the non-zero angle of incidence with respect to the perpendicular.

4. The method of claim 1, further comprising adjusting a separation of the substrate from the plasma chamber, from a first separation to a second separation greater than the first separation during the directing the ions, wherein the ions and reactive ambient provide a first degree of physical etching of the non-crystalline layer when the substrate is arranged at the first separation, and a second degree of physical etching that is greater than the first degree when the substrate is arranged at the second separation.

5. The method of claim 4 wherein a first plasma chamber gas pressure within the plasma chamber at the first separation is equal to a second plasma chamber gas pressure within the plasma chamber at the second separation.

6. The method of claim 4, wherein a gas pressure at the substrate is changed from a first gas pressure at the first separation to a second gas pressure that is less than the first gas pressure at the second separation.

7. A method for forming a semiconductor device, comprising:
forming a non-crystalline layer over a first crystalline material in a substrate;
providing a reactive ambient around the substrate;
directing ions from a plasma to the substrate at a non-zero angle of incidence with respect to a perpendicular to a plane of the substrate,
etching the non-crystalline layer using the ions and reactive ambient to form an angled trench through the non-crystalline layer, wherein a portion of the first crystalline material at a bottom of the angled trench is exposed, the angled trench forming a non-zero angle of inclination with respect to the perpendicular; and growing a second crystalline material from the bottom of the angled trench by epitaxial growth, wherein the second crystalline material fills the angled trench, and wherein the first and second crystalline materials have mismatched lattice dimensions.

8. The method of claim 7, wherein an angle between sidewalls of the angled trench and a top surface of the first crystalline material is greater than $$\tan^{-1}\frac{h}{w},$$

where h represents a thickness of the non-crystalline layer, and w represents a width of the angled trench along the top surface of the first crystalline material, wherein the angle is between 11 degrees to 45 degrees.

9. The method of claim 7, wherein forming the angled trench comprising:
generating the plasma in a plasma chamber;
modifying a shape of a plasma sheath boundary of the plasma using an extraction plate; and
applying an extraction voltage between the substrate a plasma chamber to generate an angled ion beam that is incident upon the substrate when the reactive ambient is around the substrate.

10. The method of claim 7, further comprising forming a functional structure narrower than the angled trench by etching an upper portion of the second crystalline material.

11. The method of claim 7, further comprising forming a functional structure narrower than the angled trench by depositing a third crystalline material in a vertical narrow trench disposed over the second crystalline material.

12. The method of claim 7, wherein the first crystalline material comprises a silicon {100} substrate, and wherein the non-zero angle of inclination comprises an angle of 30 degrees to 50 degrees.

13. The method of claim 8, further comprising setting an aspect ratio, h/w, of the angled trench so that defects that are generated from the bottom of the angled trench and propagate along planes parallel to a width of the angled trench terminate at the sidewalls of the angled trench.

14. The method of claim 7, wherein the first crystalline material comprises silicon or doped silicon and the second crystalline material comprises binary or ternary material comprising a Group III element and a Group V element.

15. The method of claim 14, wherein the Group III element comprises one of gallium (Ga), aluminum (Al) and indium (In), and the Group V element comprises one of nitrogen (N), phosphorus (P), and arsenic (As).

16. A method for forming a semiconductor device, comprising:
forming a dielectric layer over a silicon-containing crystalline substrate;
forming an angled trench by etching the dielectric layer using ions in combination with a reactive ambient, to expose a portion of the silicon-containing crystalline substrate at a bottom of the angled trench, wherein an angle of inclination between sidewalls of the angled trench and a top surface of the silicon-containing crystalline substrate is greater than $$\tan^{-1}\frac{h}{w},$$

where h represents a thickness of the dielectric layer, and w represents a width of the angled trench along the top surface of the silicon-containing crystalline substrate;
etching the exposed silicon-containing crystalline substrate at the bottom of the angled trench to produce a surface along (111) crystal plane direction; and
forming a crystalline material comprising a Group III element and a Group V element in the angled trench by epitaxial growth.

17. The method of claim 16, wherein forming the angled trench comprising:
generating a plasma in a plasma chamber adjacent the substrate;
modifying a sheath of the plasma to generate an angled ion beam that is extracted from the sheath and directed toward the substrate at a non-zero angle of incidence with respect to a perpendicular to a plane of the substrate; and
providing a reactive ambient proximate the substrate, wherein the angled trench is formed by anisotropic etching of the dielectric layer.

18. The method of claim 16, wherein the forming the angled trench comprises forming the angled trench having an angle of inclination of greater than 30 degrees with respect to a perpendicular to a plane of the substrate, without tilting the substrate with respect to the perpendicular.

19. A method for etching a substrate, comprising:
providing a reactive ambient around the substrate when a non-crystalline layer is disposed over a first crystalline material in the substrate;
generating a plasma in a plasma chamber;
modifying a shape of a plasma sheath boundary of the plasma;
extracting ions from the plasma;
directing the ions to the substrate at a non-zero angle of incidence with respect to a perpendicular to a plane of the substrate, wherein the ions and reactive ambient are effective to form an angled trench through the non-crystalline layer to expose a portion of the first crystalline material at a bottom of the angled trench, the angled trench forming a non-zero angle of inclination with respect to the perpendicular; and
adjusting a separation of the substrate from the plasma chamber, from a first separation to a second separation greater than the first separation during the directing the ions, wherein the ions and reactive ambient provide a first degree of physical etching of the non-crystalline layer when the substrate is arranged at the first separation, and a second degree of physical etching that is greater than the first degree when the substrate is arranged at the second separation.

20. The method according to claim 19, wherein a gas pressure at the substrate is changed from a first gas pressure at the first separation to a second gas pressure that is less than the first gas pressure at the second separation.

* * * * *